US007339291B2

(12) United States Patent
Mori

(10) Patent No.: US 7,339,291 B2
(45) Date of Patent: Mar. 4, 2008

(54) ULTRASONIC TRANSDUCER AND ULTRASONIC VIBRATION DEVICE USING THE SAME

(75) Inventor: Teruo Mori, Tokyo (JP)

(73) Assignee: TDK Corporation, Tokyo (JP)

( * ) Notice: Subject to any disclaimer, the term of this patent is extended or adjusted under 35 U.S.C. 154(b) by 93 days.

(21) Appl. No.: 10/548,435

(22) PCT Filed: Mar. 11, 2004

(86) PCT No.: PCT/JP2004/003241

§ 371 (c)(1),
(2), (4) Date: Sep. 9, 2005

(87) PCT Pub. No.: WO2004/087341

PCT Pub. Date: Oct. 14, 2004

(65) Prior Publication Data

US 2006/0158063 A1 Jul. 20, 2006

(30) Foreign Application Priority Data

Mar. 31, 2003 (JP) ............................ 2003-094689

(51) Int. Cl.
*H01L 41/06* (2006.01)

(52) U.S. Cl. ........................................................ 310/26

(58) Field of Classification Search ................... 310/26
See application file for complete search history.

(56) References Cited

U.S. PATENT DOCUMENTS 5,982,054 A * 11/1999 Rathore et al. ............... 310/26
2005/0029878 A1* 2/2005 Flanagan et al. ............. 310/26
2005/0146231 A1* 7/2005 Or et al. ....................... 310/26

FOREIGN PATENT DOCUMENTS

| | | | | |
|---|---|---|---|---|
| JP | 2-251372 | * 2/1990 | 310/26 |
| JP | 2-237085 | * 9/1990 | 310/26 |
| JP | 2-288278 | * 11/1990 | 310/26 |
| JP | 3-169086 | * 7/1991 | 310/26 |
| JP | 3-169087 | * 7/1991 | 310/26 |
| JP | 3-285577 | * 12/1991 | 310/26 |
| JP | 4-229085 | * 8/1992 | |
| JP | 5-282044 | * 10/1993 | |
| JP | U 05-76194 | 10/1993 | |
| JP | 06-088755 | * 3/1994 | |
| JP | A 09-075847 | 3/1997 | |
| JP | A 11-019608 | 1/1999 | |
| JP | A 2002-025962 | 1/2002 | |
| JP | 2004-266035 | * 9/2004 | |

* cited by examiner

*Primary Examiner*—Thomas M. Dougherty
(74) *Attorney, Agent, or Firm*—Oliff & Berridge, PLC

(57) ABSTRACT

An ultrasonic transducer includes a giant magnetostrictive rod 12 of a columnar shape which is made of a giant magnetostrictive member, and vibration plates 14 and 16 which are made of plate members having a larger diameter than that of the giant magnetostrictive rod 12 and are adhered and fixed to end surfaces in an axial direction of this giant magnetostrictive rod 12. The ultrasonic transducer can efficiently transmit ultrasonic vibration by expansion and contraction of the magnetostrictive rod in spite of a small and simple structure.

17 Claims, 7 Drawing Sheets

ULTRASONIC TRANSDUCER AND ULTRASONIC VIBRATION DEVICE USING THE SAME

TECHNICAL FIELD

The present invention relates to an ultrasonic transducer configured to generate ultrasonic vibration by expansion and contraction of a magnetostrictive rod and to an ultrasonic vibration device using the same. More specifically, the present invention relates to an ultrasonic transducer, which is capable of efficiently transmitting the ultrasonic vibration by expansion and contraction of the magnetostrictive rod in spite of a small and simple structure and capable of obtaining a high cavitation effect particularly when disposed in a liquid, and to an ultrasonic vibration device using the same.

BACKGROUND ART

Conventionally, devices configured to apply an impact force of cavitation bubble collapse to cleaning, blending, beating, and the like have been widely known.

A device configured to inject high-pressure water into a liquid so as to generate cavitation around this high-pressure water has been disclosed as one of these devices (see Japanese Patent Laid-Open Publication No. Hei 11-19608, for example). However, this device applying the high-pressure water required high water pressure and had a problem that a cavitation effect tended to fluctuate due to viscosity, temperature, and the like of the liquid.

As a measure for solving such problems, a device configured to dispose a piezoelectric transducer, a magnetostrictive transducer or the like in contact with a container, and to generate cavitation by subjecting a liquid inside the container to ultrasonic vibration has been proposed (see Japanese Patent Laid-Open Publication No. 2002-25962, for example).

However, these publicly known conventional ultrasonic transducers cause ultrasonic vibration of the liquid inside through the container, and therefore had a problem that vibration was attenuated by the container and the cavitation effect was thereby reduced.

Here, it was also necessary to take an effect of a mechanical resonance frequency of the container into account beforehand, which caused a problem of complication of designing.

DISCLOSURE OF THE INVENTION

The present invention has been made to solve the foregoing problems. An object of the present invention is to provide an ultrasonic transducer, which is capable of efficiently transmitting ultrasonic vibration by expansion and contraction of a magnetostrictive rod in spite of a small and simple structure and capable of obtaining a high cavitation effect particularly when disposed in a liquid, and to provide an ultrasonic vibration device using the same.

As a result of research, the inventor of the present invention has accomplished a measure which can efficiently transmit ultrasonic vibration by expansion and contraction of a magnetostrictive rod.

According, various embodiments of the invention provide:

That is, the present invention described below allows the aforementioned objects to be achieved.

(1) An ultrasonic transducer comprising: a magnetostrictive rod of a columnar shape made of a magnetostrictive member; and a vibration plate made of a plate member having a larger diameter than a diameter of the magnetostrictive rod, the vibration plate being adhered and fixed to an end surface in an axial direction of the magnetostrictive rod.

(2) The ultrasonic transducer according to (1), wherein the vibration plates are provided on both ends in the axial direction of the magnetostrictive rod.

(3) The ultrasonic transducer according to (2), wherein the pair of vibration plates provided on both the ends in the axial direction are formed of a pair of first and second bias magnets configured to be able to apply a bias magnetic field to the magnetostrictive rod.

(4) The ultrasonic transducer according to (3), further comprising: a third bias magnet disposed between the pair of first and second bias magnets and magnetized in a direction to attract part of the bias magnetic field generated by the first and second vibration plates toward the magnetostrictive rod.

(5) The ultrasonic transducer according to (2), wherein the pair of vibration plates provided on the both ends in the axial direction also function as magnetic yokes, the magnetostrictive rod is formed of a pair of separate magnetostrictive rods which are separately disposed substantially in the vicinity of a center of a space between the pair of vibration plates with provision of a gap, and a bias magnet configured to be able to apply a bias magnetic field to the pair of separate magnetostrictive rods is disposed in the gap, whereby the separate magnetostrictive rods are connected in the axial direction.

(6) The ultrasonic transducer according to any one of (1) to (5), comprising: a bolted structure configured to apply a compressive preload in the axial direction to the magnetostrictive rod.

(7) The ultrasonic transducer according to any one of (1) to (6), wherein the magnetostrictive rod is formed of a giant magnetostrictive member employing a giant magnetostrictive element as a material.

(8) An ultrasonic vibration device comprising: the ultrasonic transducer according to any one of (1) to (7); and an electromagnetic coil disposed to surround the ultrasonic transducer and configured to vibrate the ultrasonic transducer by controlling a size of a magnetic field to be applied.

(9) The ultrasonic vibration device according to (8), wherein the single electromagnetic coil is provided with the multiple ultrasonic transducers.

(10) The ultrasonic vibration device according to (9), wherein the multiple ultrasonic transducers are arranged in a circumferential direction of the electromagnetic coil.

(11) The ultrasonic vibration device according to (8), further comprising: a tube of a substantially cylindrical shape made of a magnetically permeable member and configured to be able to circulate a fluid, wherein the ultrasonic transducer is disposed in an internal space of the tube, and the electromagnetic coil is disposed on an outer periphery of the tube.

(12) The ultrasonic vibration device according to (11), wherein the ultrasonic transducer disposed in the internal space of the tube is held by a net suspended inside the internal space.

(13) The ultrasonic vibration device according to (11) or (12), wherein the single tube is provided with a plurality of at least one of the ultrasonic transducers and the electromagnetic coils.

(14) The ultrasonic vibration device according to (8), wherein the electromagnetic coil is disposed on an outer periphery of the magnetostrictive rod so as to surround the magnetostrictive rod, and the electromagnetic coil and the magnetostrictive rod are integrally molded.

BEST MODES FOR CARRYING OUT THE INVENTION

Now, examples of an embodiment of the present invention will be described below with reference to the accompanying drawings.

Figure 1:
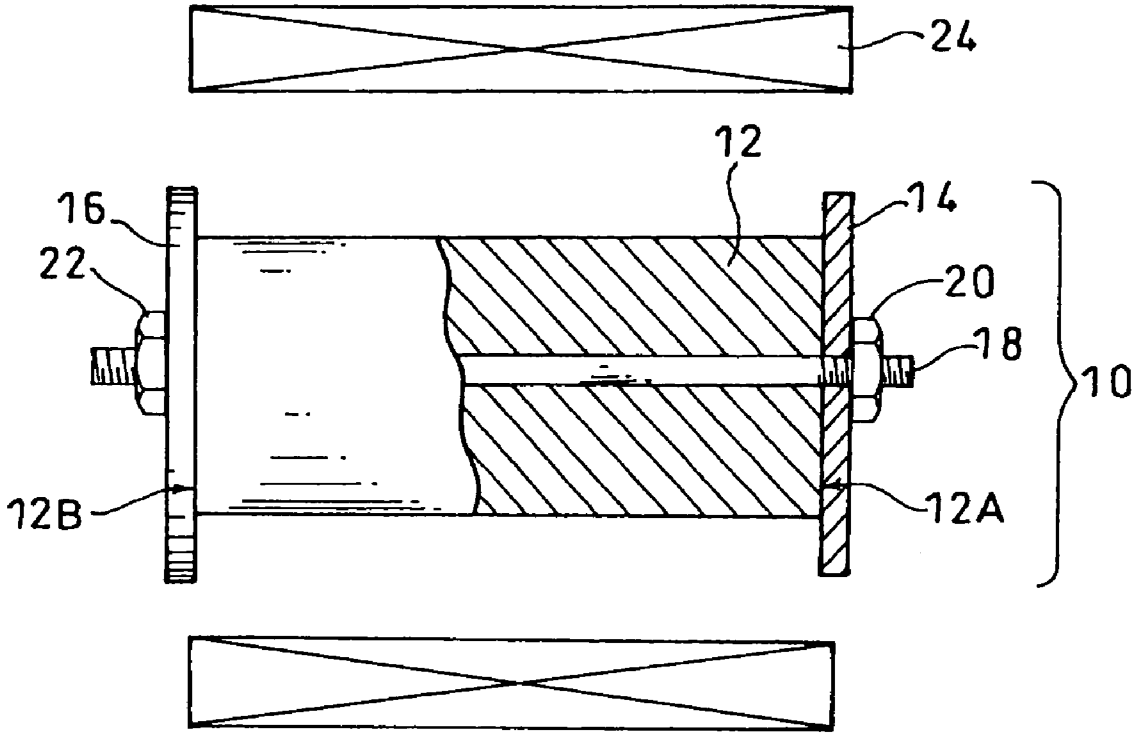
FIG. 1 is a front view schematically showing cross sections of an ultrasonic transducer and an electromagnetic coil according to a first example of an embodiment of the present invention.

As shown in FIG. 1, an ultrasonic transducer 10 according to a first example of an embodiment of the present invention includes a giant magnetostrictive rod 12 of a columnar shape disposed horizontally in the drawing, a pair of first and second vibration plates 14 and 16, a bolt 18, and a pair of nuts 20 and 22.

The pair of first and second vibration plates 14 and 16 are made of bias magnets of a plate shape having a larger diameter than that of the giant magnetostrictive rod 12 of the columnar shape. The vibration plates 14 and 16 are adhered and fixed to both ends 12A and 12B in an axial direction of the giant magnetostrictive rod 12, respectively.

The bolt 18 is disposed in a lateral direction in FIG. 1 so as to penetrate the giant magnetostrictive rod 12 as well as the first and second vibration plates 14 and 16. Moreover, the bolt 18 constitutes a bolted structure for fastening and fixing the first and second vibration plates 14 and 16 to the giant magnetostrictive rod 12 in its axial direction by use of the pair of nuts 20 and 22 that are screwed thereon from both ends in the axial direction. In this way, a compressive preload and a bias magnetic field are applied to the giant magnetostrictive rod 12 by being constricted in the axial direction. Accordingly, the ultrasonic transducer 10 is configured to be able to enhance efficiency by use of an increase in an amount of displacement of the giant magnetostrictive rod 12.

The giant magnetostrictive rod 12 of the columnar shape is formed of a giant magnetostrictive member, which applies a giant magnetostrictive element as its material. Here, the "giant magnetostrictive element" refers to a magnetostrictor, which is made of a powder sintered alloy or a single crystal alloy containing a rare earth element and/or specific transition metal (such as terbium, dysprosium or iron) as a main component. This giant magnetostrictive element has a characteristic to generate large displacement when a magnetic field is applied from outside. Therefore, it is possible to allow the giant magnetostrictive rod 12 to expand and contract at high speed and to generate ultrasonic vibration by controlling the size of the magnetic field to be applied to the giant magnetostrictive rod 12 using an electromagnetic coil and the like.

Next, an operation of the ultrasonic transducer 10 will be described by use of FIG. 2.

For instance, a case of controlling the size of the magnetic field to be applied to this ultrasonic transducer 10 by using an electromagnetic coil 24 as shown in FIG. 1 will now be considered.

Figure 2:
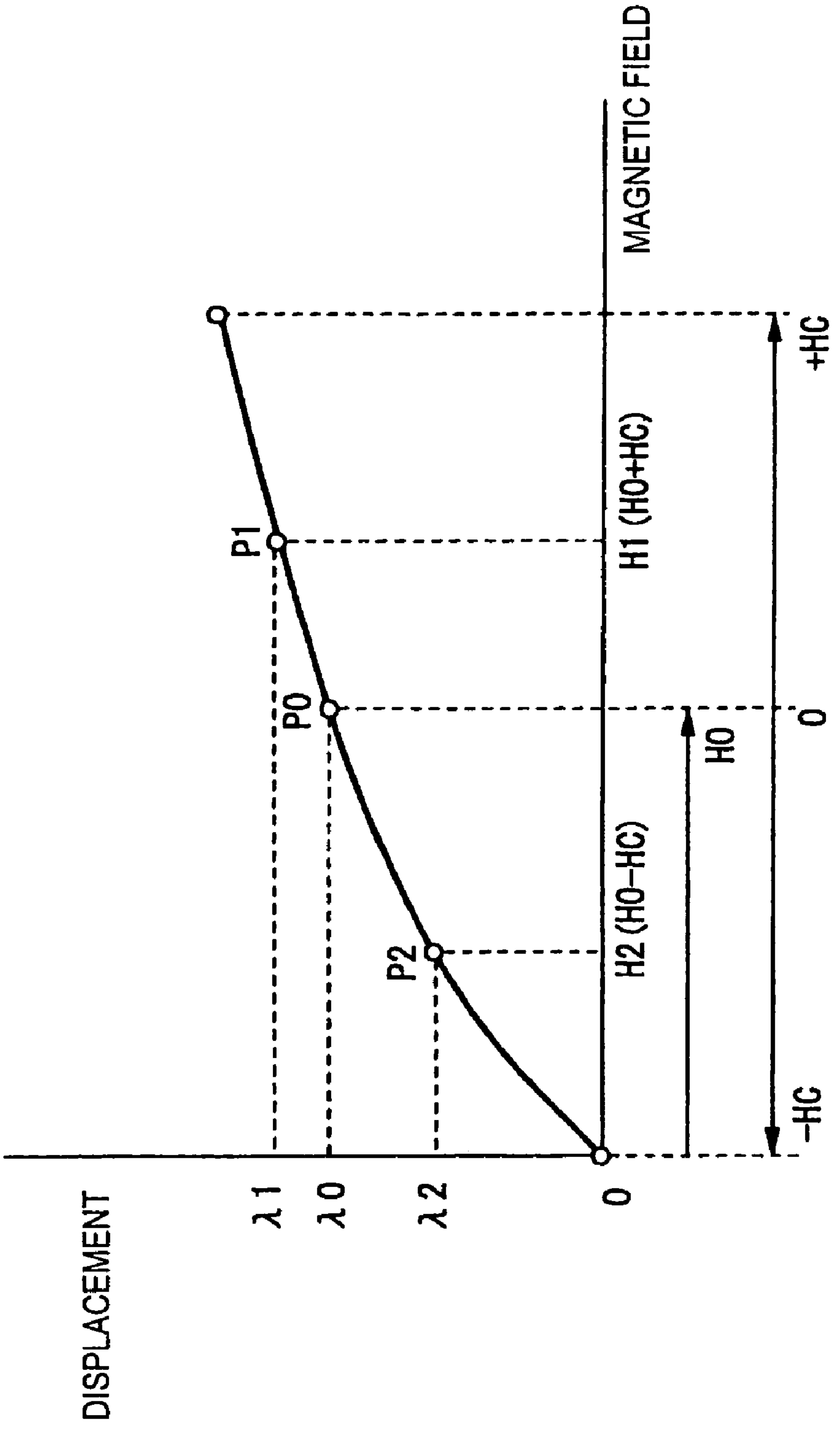
FIG. 2 is a graph showing a relation between a magnetic field to be applied to a giant magnetostrictive rod of the ultrasonic transducer shown in FIG. 1 and displacement of the giant magnetostrictive rod.

First, as shown in FIG. 2, when electricity is not applied to the electromagnetic coil 24 (a point P0 in FIG. 2), a coil magnetic field HC is not applied from the electromagnetic coil 24 to the giant magnetostrictive rod 12 (HC=0). Accordingly, only a bias magnetic field H0 is applied from the first and second vibration plates 14 and 16. As a result, initial displacement λ0 attributable to the bias magnetic field H0 occurs in the giant magnetostrictive rod 12, and the ultrasonic transducer 10 expands in the axial direction as equivalent to the initial displacement λ0.

Meanwhile, when the electricity is applied to the electromagnetic coil 24 and a coil magnetic field +HC is applied in the same direction as the bias magnetic field H0 (a point P1 in FIG. 2), the coil magnetic field +HC from the electromagnetic coil 24 is added to the bias magnetic field H0. Accordingly, a combined magnetic field H1 (=H0+HC) of the bias magnetic field H0 and the coil magnetic field +HC is applied to the giant magnetostrictive rod 12. That is, by applying the coil magnetic field +HC in the same direction as the bias magnetic field H0, the combined magnetic field H1 to be applied to the giant magnetostrictive rod 12 is gradually increased, whereby the ultrasonic transducer 10 expands from the state of initial displacement λ0.

On the contrary, when a coil magnetic field −HC is applied in the reverse direction to the bias magnetic field H0 (a point P2 in FIG. 2) by use of the electromagnetic coil 24, the coil magnetic field −HC from the electromagnetic coil 24 acts in the direction to cancel the bias magnetic field H0. Accordingly, a combined magnetic field H2 (=H0−HC) of the bias magnetic field H0 and the coil magnetic field −HC is applied to the giant magnetostrictive rod 12. That is, by applying the coil magnetic field −HC in the reverse direction to the bias magnetic field H0, the combined magnetic field H2 to be applied to the giant magnetostrictive rod 12 is gradually decreased, whereby the ultrasonic transducer 10 contracts from the state of initial displacement λ0.

In this way, by applying the coil magnetic field +HC in the same direction as the bias magnetic field H0 and the coil magnetic field −HC in the reverse direction thereto alternately and continuously to the ultrasonic transducer 10, it is possible to allow the ultrasonic transducer 10 to expand and contract at high speed and thereby to generate ultrasonic vibration.

The ultrasonic transducer 10 according to the first example of the embodiment of the present invention includes the first and second vibration plates 14 and 16 made of the plate members having the larger diameter than that of the giant magnetostrictive rod 12. Hence it is possible to transmit the ultrasonic vibration to the outside by use of these first and second vibration plates 14 and 16 without interposition of a container and the like. Therefore, it is possible to transmit the ultrasonic vibration directly to a liquid by disposing the ultrasonic transducer 10 in the liquid, for example, and thereby to obtain a high cavitation effect. Moreover, since the first and second vibration plates 14 and 16 are adhered and fixed to the end surfaces 12A and 12B in the axial direction of the giant magnetostrictive rod 12 of the columnar shape, it is possible to transmit the ultrasonic vibration by expansion and contraction of the giant magnetostrictive rod 12 efficiently in spite of the small and simple structure. In addition, it is possible to obtain a higher effect because the ultrasonic transducer 10 is provided with two pieces of the first and second vibration plates 14 and 16 on the both ends 12A and 12B in the axial direction of the giant magnetostrictive rod 12.

Meanwhile, the first and second vibration plates 12 and 14 also function as the bias magnets. Accordingly, it is not necessary to apply the bias magnetic field by use of a separate measure. Moreover, it is possible to achieve cost reduction and miniaturization by reducing the number of components.

Next, an ultrasonic transducer 30 according to a second example of the embodiment of the present invention will be described by use of FIG. 3.

As shown in the drawing, this ultrasonic transducer 30 is configured to dispose a giant magnetostrictive rod 32 and a bias magnet 33 between the pair of first and second vibration plates 14 and 16 in the ultrasonic transducer 10 shown in FIG. 1. Here, explanation of similar constituents to those in the above-described ultrasonic transducer 10 will be omitted.

The giant magnetostrictive rod 32 includes a pair of separate giant magnetostrictive rods 32A and 32B which are separated approximately in the vicinity of the center of a space between the pair of the first and second vibration plates 14 and 16 with provision of a gap. Moreover, the bias magnet 33 is disposed in the gap between this pair of separate giant magnetostrictive rods 32A and 32B, thereby connecting the pair of separate giant magnetostrictive rods 32A and 32B in the axial direction.

This third bias magnet 33 is magnetized in a direction to attract part of the bias magnetic field generated by the pair of first and second vibration plates 14 and 16 toward the giant magnetostrictive rod 32. Therefore, according to the ultrasonic transducer 30, it is possible to achieve enhancement of efficiency of the transducer by applying the bias magnetic field more efficiently.

Figure 4:
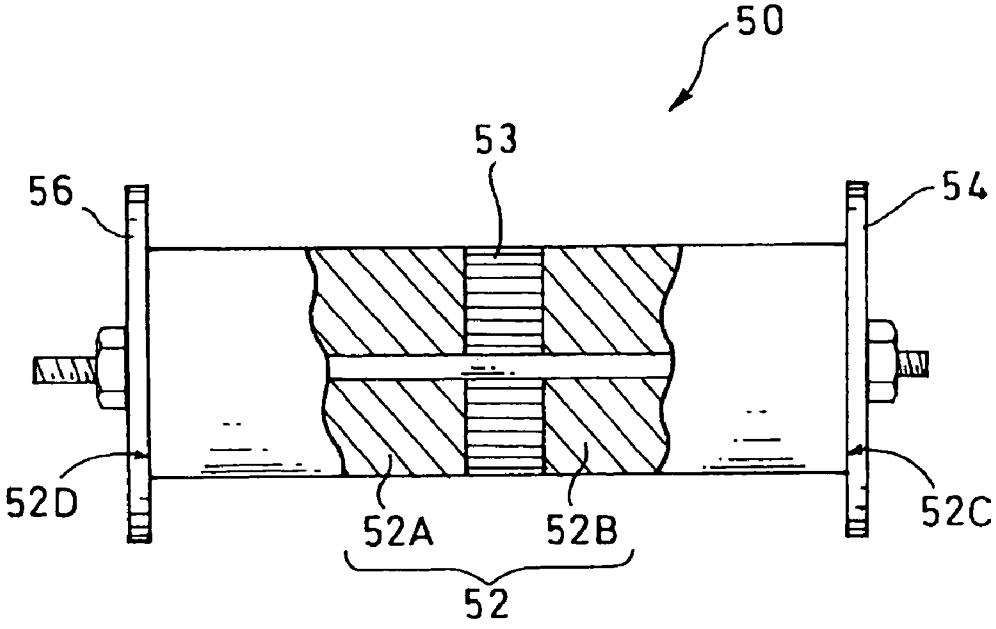
FIG. 4 is a front view schematically showing a cross section of an ultrasonic transducer according to a third example of the embodiment of the present invention.

Next, an ultrasonic transducer 50 according to a third example of the embodiment of the present invention will be described by use of FIG. 4.

Figure 3:
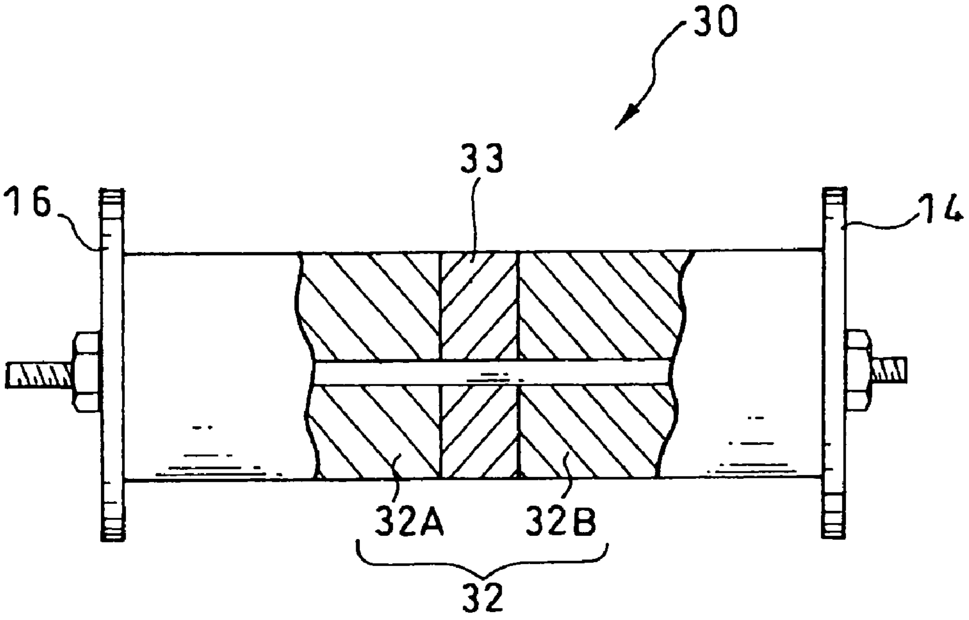
FIG. 3 is a front view schematically showing a cross section of an ultrasonic transducer according to a second example of the embodiment of the present invention.

As shown in the drawing, this ultrasonic transducer 50 is configured to dispose a pair of first and second vibration plates 54 and 56 made of soft magnetic members instead of the pair of first and second vibration plates 14 and 16 described in the ultrasonic transducer 30 shown in FIG. 3, and to dispose a giant magnetostrictive rod 52 and a bias magnet 53 therebetween. Here, explanation of similar constituents to those in the above-described ultrasonic transducer 30 will be omitted.

The giant magnetostrictive rod 52 includes a pair of separate giant magnetostrictive rods 52A and 52B which are separated approximately in the vicinity of the center of a space between the pair of the first and second vibration plates 54 and 56 with provision of a gap. Moreover, the bias magnet 53 capable of applying a bias magnetic field is disposed in the gap between this pair of separate giant magnetostrictive rods 52A and 52B, thereby connecting the pair of separate giant magnetostrictive rods 52A and 52B in the axial direction.

Moreover, the pair of first and second vibration plates 54 and 56 are made of magnetic yokes of a plate shape having a larger diameter than that of the giant magnetostrictive rod 52, and are adhered and fixed to both ends 52C and 52D in an axial direction of the giant magnetostrictive rod 52, respectively.

In this way, in the ultrasonic transducer 50, a magnetic circuit is formed of the bias magnet 53 and the pair of first and second vibration plates (also functioning as the magnetic yokes) 54 and 56. Therefore, according to this ultrasonic transducer 50, it is possible to achieve enhancement of efficiency of the transducer by applying the bias magnetic field more efficiently.

Next, an ultrasonic vibration device 70 applying the ultrasonic transducer 10 according to the first example of the embodiment of the present invention will be described by use of FIG. 5. Here, explanation of the above-described ultrasonic transducer 10 will be omitted to avoid repetitive explanation, and other parts of the configuration will only be described.

Figure 5:
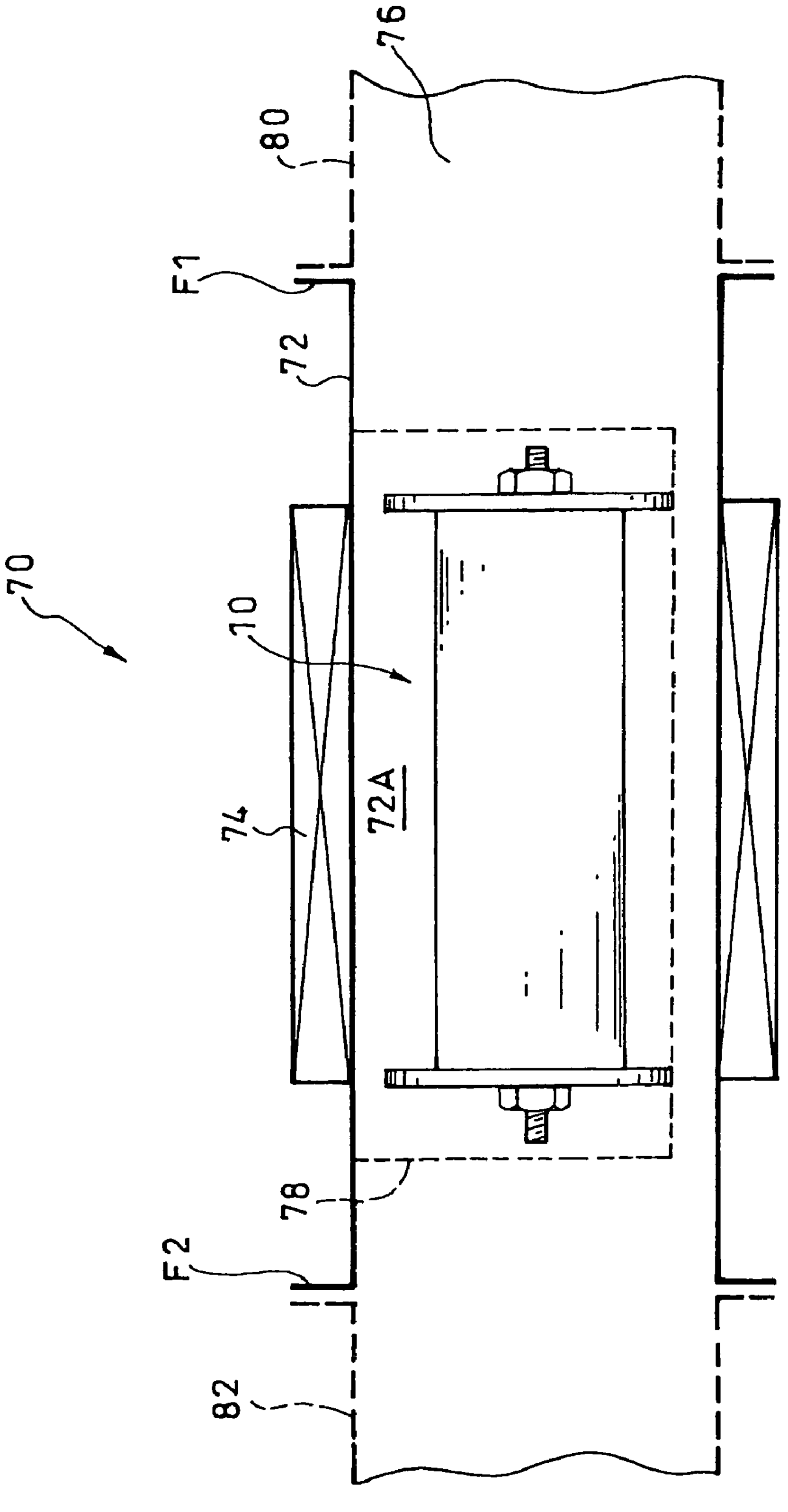
FIG. 5 is a front view schematically showing a cross section of an ultrasonic vibration device applying the ultrasonic transducer in FIG. 1.

As shown in FIG. 5, this ultrasonic vibration device 70 includes a tube 72 of a substantially cylindrical shape laid horizontally in the drawing, the ultrasonic transducer 10, and an electromagnetic coil 74.

The tube 72 of the substantially cylindrical shape is made of a magnetically permeable member, and an internal space 72A which allows circulation of a fluid 76 such as a liquid or a powdered body is formed inside. The ultrasonic transducer 10 is disposed in this internal space 72A horizontally in the drawing, and is held by a net 78 suspended inside the internal space 72A. Meanwhile, the electromagnetic coil 74 is disposed on the outer periphery of this tube 72 so as to surround the ultrasonic transducer 10 from outside of the tube 72. Here, fitting flanges F1 and F2 which are connectable to external devices 80 and 82 are respectively provided on both ends in the axial direction of this tube 72.

According to this ultrasonic vibration device 70, it is possible to cause ultrasonic vibration of the ultrasonic transducer 10 disposed in the internal space 72A of the tube 72 by controlling the size of the magnetic field to be applied to the electromagnetic coil 74. Therefore, it is possible to transmit the ultrasonic vibration directly to the fluid 76 circulating in the internal space 72A. In particular, it is possible to obtain a high cavitation effect when the liquid circulates in the internal space 72A.

Note that the giant magnetostrictive rod 12 (or 32 or 52) has been formed of the giant magnetostrictive material applying the giant magnetostrictive element as the material in the examples of the embodiment. However, the present invention is not limited to this configuration. It is also possible to use a magnetostrictive member made of a magnetostrictor.

The ultrasonic transducer according to the present invention is not limited to the structures, the shapes, and the like of the ultrasonic transducers 10, 30, and 50 of the first to third examples of the embodiment. The ultrasonic transducer only needs to include a magnetostrictive rod of a columnar shape made of a magnetostrictive member, and a vibration plate which is made of a plate member having a larger diameter than that of the magnetostrictive rod and is adhered and fixed to an end in an axial direction of this magnetostrictive rod. Therefore, it is also possible to configure the ultrasonic transducer to include the vibration plate provided only on one end in the axial direction of the magnetostrictive rod, for example.

Meanwhile, the ultrasonic vibration device according to the present invention is not limited to the structure, the shape, and the like of the ultrasonic vibration device 70 of the example of the embodiment. The ultrasonic vibration device only needs to include the ultrasonic transducer according to the present invention, and an electromagnetic coil disposed so as to surround this ultrasonic transducer and configured to vibrate the ultrasonic transducer by controlling the size of a magnetic field to be applied thereto.

Figure 6:
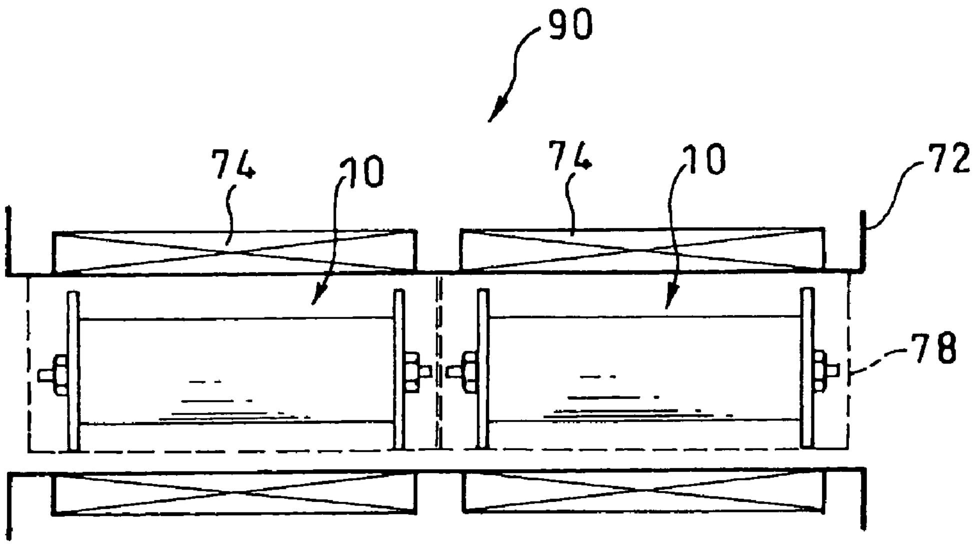
FIG. 6 is a front view schematically showing a cross section of an ultrasonic vibration device applying the multiple ultrasonic transducers and the multiple electromagnetic coils in FIG. 5.
Figure 7:
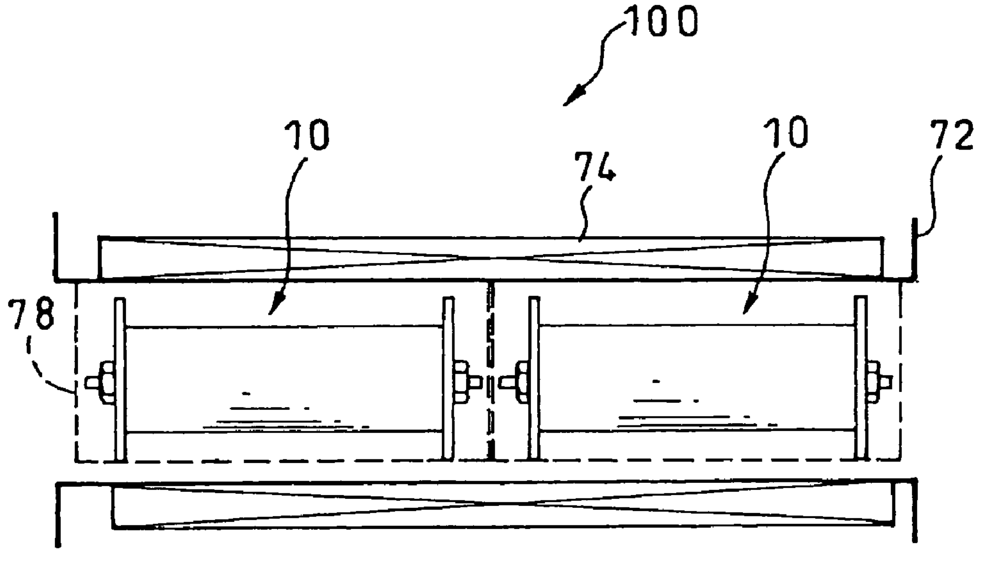
FIG. 7 is a front view schematically showing a cross section of an ultrasonic vibration device applying the multiple ultrasonic transducers in FIG. 5.

Therefore, it is also possible to provide the single tube 72 with the multiple ultrasonic transducers 10 and the multiple electromagnetic coils 74 as in an ultrasonic vibration device 90 shown in FIG. 6, for example. Alternatively, it is also possible to provide the single tube 72 and the single electromagnetic coil 74 with the multiple ultrasonic transducers 10 as in an ultrasonic vibration device 100 shown in FIG. 7.

Figure 8:
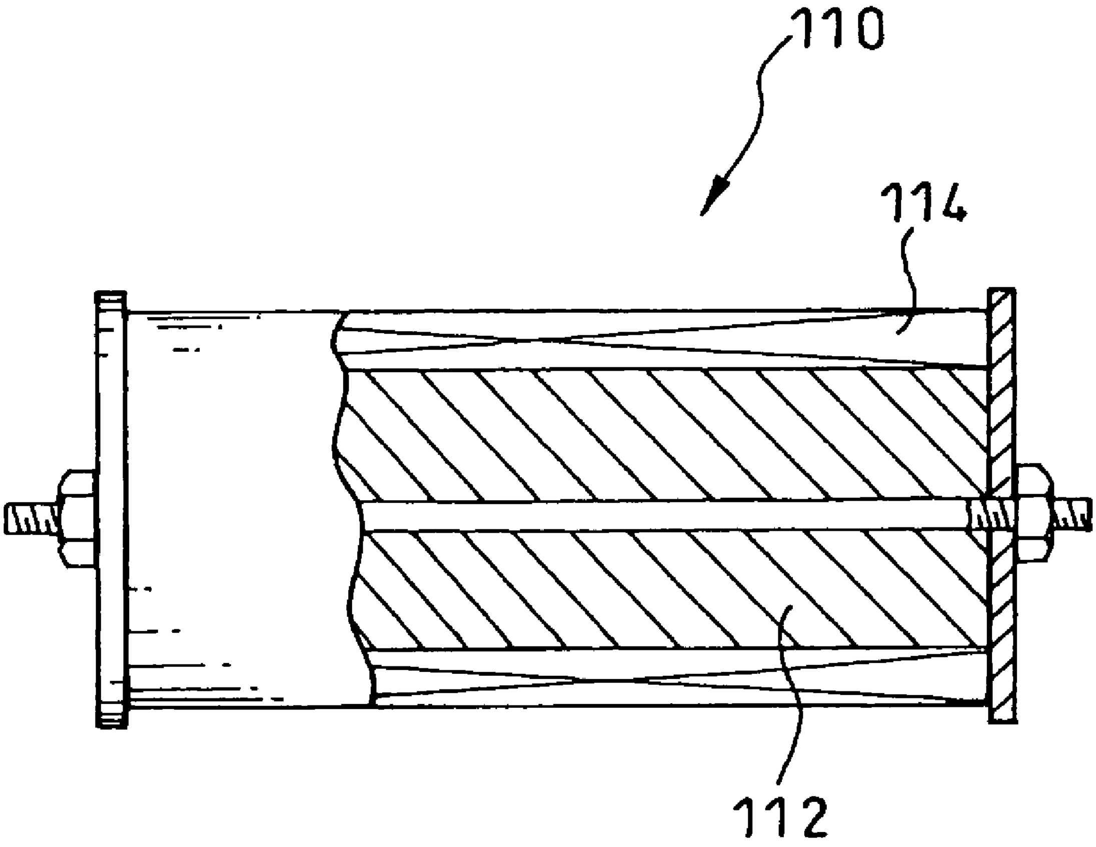
FIG. 8 is a front view schematically showing a cross section of an ultrasonic vibration device in which an electromagnetic coil and a giant magnetostrictive rod are integrally molded.

Meanwhile, as in an ultrasonic vibration device 110 shown in FIG. 8, it is also possible to dispose an electromagnetic coil 114 on the outer periphery of a giant magnetostrictive rod 112 so as to surround this rod, and to mold the electromagnetic coil 114 and the giant magnetostrictive rod 112 integrally. According to this ultrasonic vibration device 110, it is possible to put the device including the electromagnetic coil 114 directly into a fluid, and thereby to enhance freedom of a device layout.

Figure 9:
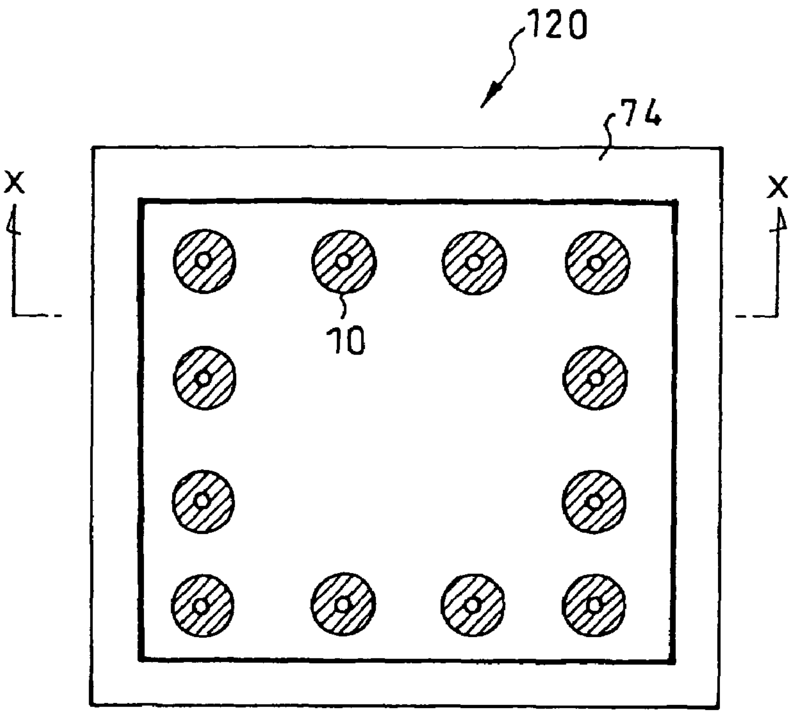
FIG. 9 is a plan view schematically showing an ultrasonic vibration device in which a single electromagnetic coil is provided with multiple giant magnetostrictive rods.
Figure 10:
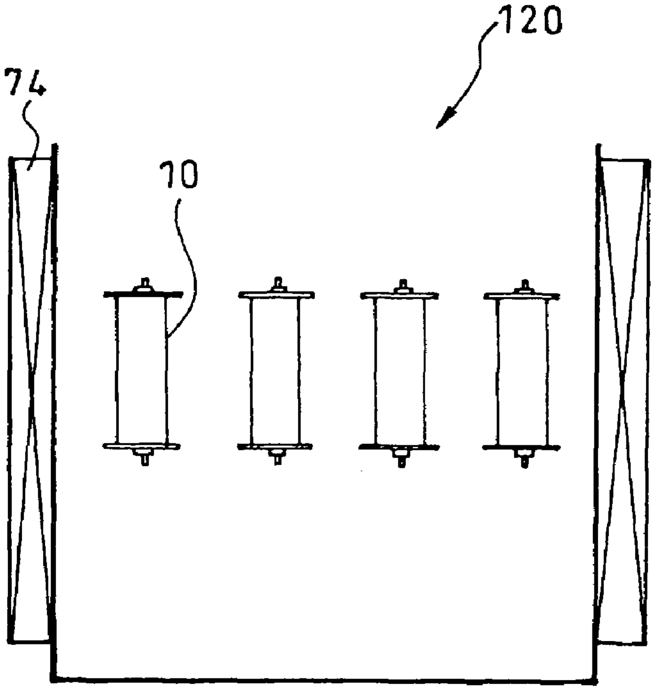
FIG. 10 is a cross-sectional view taken along the X-X line in FIG. 9.

In addition, as in an ultrasonic vibration device 120 shown in FIG. 9 and FIG. 10, it is also possible to provide the single electromagnetic coil 74 with the multiple ultrasonic transducers 10 (12 pieces in this example), and to arrange the multiple ultrasonic transducers 10 in a circumferential direction of the electromagnetic coil 74.

INDUSTRIAL APPLICABILITY

The ultrasonic transducer of the present invention and the ultrasonic vibration device using the ultrasonic transducer have excellent effects that it is possible to efficiently transmit ultrasonic vibration by expansion and contraction of the magnetostrictive rod in spite of small and simple structures, and that it is possible to obtain a high cavitation effect particularly when disposed in a liquid.

What is claimed is:

1. An ultrasonic vibration device comprising:

an ultrasonic transducer; and an electromagnetic coil disposed to surround the ultrasonic transducer and configured to vibrate the ultrasonic transducer by controlling a size of a magnetic field to be applied, wherein the ultrasonic transducer comprising:

a magnetostrictive rod of a columnar shape made of a magnetostrictive member;

a vibration plate made of a plate member having a larger diameter than a diameter of the magnetostrictive rod, the vibration plate being adhered and fixed to an end surface in an axial direction of the magnetostrictive rod, the single electromagnetic coil is provided with the multiple ultrasonic transducers, and the multiple ultrasonic transducers are arranged in a circumferential direction of the electromagnetic coil.

2. The ultrasonic vibration device according to claim 1, wherein the vibration plates are provided on both ends in the axial direction of the magnetostrictive rod.

3. The ultrasonic vibration device according to claim 2, wherein the pair of vibration plates provided on both the ends in the axial direction are formed of a pair of first and second bias magnets configured to be able to apply a bias magnetic field to the magnetostrictive rod.

4. The ultrasonic vibration device according to claim 3, further comprising:

a third bias magnet disposed between the pair of first and second bias magnets and magnetized in a direction to attract part of the bias magnetic field generated by the first and second vibration plates toward the magnetostrictive rod.

5. The ultrasonic vibration device according to claim 4, comprising:

a bolted structure configured to apply a compressive preload in the axial direction to the magneto strictive rod.

6. The ultrasonic vibration device according to claim 4, wherein the magnetostrictive rod is formed of a giant magnetostrictive member employing a giant magnetostrictive element as a material.

7. The ultrasonic vibration device according to claim 3, comprising:

a bolted structure configured to apply a compressive preload in the axial direction to the magnetostrictive rod.

8. The ultrasonic vibration device according to claim 3, wherein the magnetostrictive rod is formed of a giant magnetostrictive member employing a giant magnetostrictive element as a material.

9. The ultrasonic vibration device according to claim 2, wherein the pair of vibration plates provided on the both ends in the axial direction are function as magnetic yokes, the magnetostrictive rod is formed of a pair of separate magnetostrictive rods which are separately disposed substantially in the vicinity of a center of a space between the pair of vibration plates with provision of a gap, and a bias magnet configured to be able to apply a bias magnetic field to the pair of separate magnetostrictive rods is disposed in the gap, whereby the separate magnetostrictive rods are connected in the axial direction.

10. The ultrasonic vibration device according to claim 2, wherein the magnetostrictive rod is formed of a giant magneto strictive member employing a giant magnetostrictive element as a material.

11. The ultrasonic vibration device according to claim 1, wherein the magnetostrictive rod is formed of a giant magnetostrictive member employing a giant magnetostrictive element as a material.

12. The ultrasonic vibration device according to claim 1, further comprising:

a tube of a substantially cylindrical shape made of a magnetically permeable member and configured to be able to circulate a fluid, wherein the ultrasonic transducer is disposed in an internal space of the tube, and the electromagnetic coil is disposed on an outer periphery of the tube.

13. The ultrasonic vibration device according to claim 12, wherein the ultrasonic transducer disposed in the internal space of the tube is held by a net suspended inside the internal space.

14. The ultrasonic vibration device according to claim 12, wherein the single tube is provided with a plurality of at least any of the ultrasonic transducers and the electromagnetic coils.

15. The ultrasonic vibration device according to claim 1, wherein the electromagnetic coil is disposed on an outer periphery of the magnetostrictive rod so as to surround the magnetostrictive rod, and the electromagnetic coil and the magnetostrictive rod are integrally molded.

16. The ultrasonic vibration device according to claim 1, comprising:

a bolted structure configured to apply a compressive preload in the axial direction to the magnetostrictive rod.

17. The ultrasonic vibration device according to claim 1, comprising:

a bolted structure configured to apply a compressive preload in the axial direction to the magnetostrictive rod.

* * * * *